United States Patent
Trentzsch et al.

(10) Patent No.: US 7,994,037 B2
(45) Date of Patent: Aug. 9, 2011

(54) GATE DIELECTRICS OF DIFFERENT THICKNESS IN PMOS AND NMOS TRANSISTORS

(75) Inventors: Martin Trentzsch, Dresden (DE);
Karsten Wieczorek, Dresden (DE);
Edward Ehrichs, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 56 days.

(21) Appl. No.: 12/466,748

(22) Filed: May 15, 2009

(65) Prior Publication Data
US 2010/0025770 A1     Feb. 4, 2010

(30) Foreign Application Priority Data
Jul. 31, 2008   (DE) .................. 10 2008 035 805

(51) Int. Cl.
*H01L 27/092* (2006.01)
*H01L 21/28* (2006.01)
*H01L 21/265* (2006.01)

(52) U.S. Cl. ........................ 438/591; 438/585

(58) Field of Classification Search .................. 438/257, 438/258, 591, 585; 257/393, 904
See application file for complete search history.

(56) References Cited

U.S. PATENT DOCUMENTS

| | | | |
|---|---|---|---|
| 5,285,096 A * | 2/1994 | Ando et al. | |
| 5,286,992 A * | 2/1994 | Ahrens et al. | 257/356 |
| 5,314,834 A * | 5/1994 | Mazure et al. | 438/301 |
| 5,327,002 A * | 7/1994 | Motoyoshi | |
| 5,330,920 A * | 7/1994 | Soleimani et al. | |
| 5,432,114 A * | 7/1995 | O | |
| 5,502,009 A * | 3/1996 | Lin | |
| 5,691,217 A * | 11/1997 | Honeycutt | 438/197 |
| 5,882,993 A * | 3/1999 | Gardner et al. | 438/591 |
| 5,963,803 A * | 10/1999 | Dawson et al. | |
| 6,004,847 A * | 12/1999 | Clementi et al. | 438/258 |
| 6,033,943 A * | 3/2000 | Gardner | 438/199 |
| 6,040,607 A * | 3/2000 | Wristers et al. | 257/389 |
| 6,080,682 A * | 6/2000 | Ibok | 438/770 |
| 6,165,918 A * | 12/2000 | Jia et al. | |
| 6,235,591 B1 * | 5/2001 | Balasubramanian et al. | |
| 6,344,383 B1 * | 2/2002 | Berry et al. | |
| 6,436,771 B1 * | 8/2002 | Jang et al. | |
| 6,537,878 B1 * | 3/2003 | Liaw et al. | |
| 6,645,814 B1 * | 11/2003 | Lindsay et al. | 438/258 |
| 6,674,134 B2 * | 1/2004 | Berry et al. | 257/397 |
| 6,746,921 B2 * | 6/2004 | Lindsay et al. | 438/258 |
| 6,897,104 B2 * | 5/2005 | Tsujikawa et al. | |
| 7,041,562 B2 * | 5/2006 | Lim et al. | |

(Continued)

OTHER PUBLICATIONS

Translation of Official Communication from German Patent Office for German Patent Application No. 10 2008 035 805.3-33 dated May 5, 2009.

*Primary Examiner* — N Drew Richards
*Assistant Examiner* — Robert Carpenter
(74) *Attorney, Agent, or Firm* — Williams, Morgan & Amerson, P.C.

(57) ABSTRACT

By providing a gate dielectric material of increased thickness for P-channel transistors compared to N-channel transistors, degradation mechanisms, such as negative bias threshold voltage instability, hot carrier injection and the like, may be reduced. Due to the enhanced reliability of the P-channel transistors, overall production yield for a specified quality category may be increased, due to the possibility of selecting narrower guard bands for the semiconductor device under consideration.

20 Claims, 8 Drawing Sheets

U.S. PATENT DOCUMENTS

| | | | |
|---|---|---|---|
| 7,045,855 B2 * | 5/2006 | Fischer et al. | 257/324 |
| 7,118,974 B2 * | 10/2006 | Chen et al. | 438/287 |
| 7,550,349 B2 * | 6/2009 | Yoon | 438/257 |
| 2003/0157772 A1 * | 8/2003 | Wieczorek et al. | 438/287 |
| 2003/0232473 A1 * | 12/2003 | Yeh et al. | 438/275 |
| 2004/0023506 A1 * | 2/2004 | Pradeep et al. | 438/710 |
| 2004/0092133 A1 * | 5/2004 | Hyun et al. | 438/787 |
| 2004/0102010 A1 * | 5/2004 | Khamankar et al. | 438/287 |
| 2005/0098839 A1 | 5/2005 | Lee et al. | 257/410 |
| 2005/0170575 A1 | 8/2005 | Lee et al. | 438/197 |
| 2006/0099753 A1 | 5/2006 | Chen et al. | 438/199 |
| 2006/0121740 A1 | 6/2006 | Sakai et al. | 438/758 |
| 2006/0134864 A1 * | 6/2006 | Higashitani et al. | 438/257 |
| 2006/0223266 A1 * | 10/2006 | Lim et al. | 438/275 |
| 2008/0268630 A1 * | 10/2008 | Khan et al. | 438/587 |

* cited by examiner

GATE DIELECTRICS OF DIFFERENT THICKNESS IN PMOS AND NMOS TRANSISTORS

BACKGROUND

1. Field of the Disclosure

Generally, the present disclosure relates to sophisticated integrated circuits, such as CPUs including scaled transistor elements, and particularly to performance reducing charge trap creation at the interface between the gate dielectric material and the channel region.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles, to activate dopants and to cure crystal damage without sacrificing the electrical characteristics of the interface.

For the reasons pointed out above, silicon dioxide is preferably used in field effect transistors as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may represent limitations for performance driven circuits. That is, product reliability and lifetime are strongly correlated with short channel effects, i.e., impact ionization and hot carrier injection (HCI) in combination with gate dielectric leakage.

A further long-known effect may increasingly play an important role for CMOS devices, as threshold voltages and supply voltages are steadily reduced. It was observed in the 1960s that application of a negative voltage, possibly in combination with thermal stress, to the gate electrode of MOS transistors may result in a shift of the threshold voltage, i.e., a shift of the specific gate voltage at which a conductive channel forms adjacent to the gate insulation layer. This effect, also referred to as "negative bias temperature instability (NBTI)," is mainly present in PMOS transistors and was not considered particularly relevant for semiconductor devices in the following years due to the low influence on the overall device performance of devices, in particular as NMOS devices have increasingly been developed. This situation changed with the introduction of complex CMOS devices including high performance logic circuits, in which millions of signal nodes with PMOS and NMOS transistors are typically provided. As explained above, in these devices, the threshold voltage and the supply voltages have been reduced, while, on the other hand, the electric fields across the gate dielectrics is increased. Under such conditions, a change of the threshold voltage may have an even higher impact, since transistor operation variability may increase due to relatively higher influence of a shift of the threshold voltage. Moreover, the operating states resulting in the application of a negative voltage to the gate electrode of a PMOS transistor may depend on the signal path considered and the overall operational conditions, thereby making the threshold shift highly non-predictable and hence requiring appropriately set design criteria to ensure the desired performance of the transistors over the entire specified lifetime of the device. For example, a shift of the threshold voltage over the accumulated operating time may finally lead to violation of the timing specification of the device, which may not allow further use of the device despite the fact that no other major failure has occurred.

Generally, the NBTI effect is associated with the quality of the gate dielectric, for instance comprising silicon, oxygen and nitrogen, and also the quality of the interface between the silicon in the channel region and the gate dielectric. That is, upon a negative gate voltage, elevated temperature and other stress conditions, a charge trap may be created in the vicinity of the interface, thereby causing holes to be trapped. Due to the localized positive interface states and the trapped charges, a shift in threshold voltage may be observed that may increase over time depending on the overall stress conditions experienced by the transistors. In NMOS transistors, this effect is significantly less pronounced, since the interface states and the fixed charges are of opposite polarity, thereby resulting in a lower performance degrading net effect.

For this reason, it is important in advanced applications to appropriately select the characteristics of the gate dielectric material with respect to material composition and thickness in order to maintain hot carrier injection and NBTI effects at an acceptable level, especially for P-channel transistors. Due to the reduced design flexibility and less pronounced enhancement of device performance for semiconductor devices requiring highly scaled gate dielectric thickness values and also overall device dimensions, the present disclosure relates to methods and devices for avoiding or at least reducing the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which stress-related shift of threshold voltages over time, in particular in P-channel transistors, in combination with increased hot carrier injection effects, may be reduced by selectively providing a gate dielectric material for P-channel transistors that has an increased thickness compared to N-channel transistors, thereby providing enhanced flexibility in adjusting the overall product performance of complex integrated circuits, such as microprocessors. On the other hand, product reliability may be increased with respect to degradation mechanisms, such as NBTI, hot carrier injection and the like, for sophisticated P-channel transistors, without unduly reducing performance of the N-channel transistors, or even enhanced performance of the N-channel transistors due to higher flexibility in individually adapting the thickness of the gate dielectric material for the N-channel transistors. Although performance of the P-channel transistors may be slightly affected by the increased thickness of the gate dielectric material, product performance degradation associated with NBTI and hot carrier injection effects in P-channel transistors may be significantly less pronounced, thereby enabling a more advanced setting of product specifications for the entire semiconductor product, that is, the corresponding guard band may be selected smaller, thereby actually increasing the number of products that may have to meet superior quality requirements. The increased flexibility in providing P-channel transistors and N-channel transistors having a gate dielectric material of different thickness may be accomplished, in some illustrative aspects disclosed herein, on the basis of one additional lithography step, while, in other aspects, the sequence of providing gate dielectric materials of different thickness may be combined with the process of defining the well doping in the respective active regions, which may thus even further reduce the overall process complexity by avoiding any additional lithography steps. Moreover, in other illustrative aspects, different thickness values for gate dielectric materials may be provided in order to even further enhance overall flexibility in adjusting transistor performance and reliability.

One illustrative method disclosed herein comprises forming a first gate dielectric material on a first active region, wherein the first gate dielectric material has a first thickness. The method further comprises forming a second gate dielectric material on a second active region, wherein the second gate dielectric material has a second thickness that is less than the first thickness. Furthermore, a P-channel transistor is formed on the basis of the first dielectric material and an N-channel transistor is formed on the basis of the second gate dielectric material.

A further illustrative method disclosed herein relates to forming a gate dielectric material. The method comprises forming a base dielectric material on a first active region and a second active region, wherein the first active region comprises a first well doping. The method additionally comprises selectively forming a second well doping in the second active region by using a mask that exposes the second active region and covers the first active region. Furthermore, the base dielectric material is selectively removed by using the mask, which is then removed. Additionally, the method comprises forming a further dielectric material above the first and second active regions so as to obtain a first gate dielectric material on the first active region and a second gate dielectric material on the second active region, wherein a thickness of the second gate dielectric material is less than a thickness of the first gate dielectric material.

One illustrative semiconductor device disclosed herein comprises a first gate electrode structure including a first gate dielectric material having a first thickness. The semiconductor device further comprises an N-channel transistor comprising a second gate electrode structure including a second gate dielectric material having a second thickness that is less than the first thickness.

BRIEF DESCRIPTION OF THE DRAWINGS

The disclosure may be understood by reference to the following description taken in conjunction with the accompanying drawings, in which like reference numerals identify like elements, and in which.

Figure 1A:
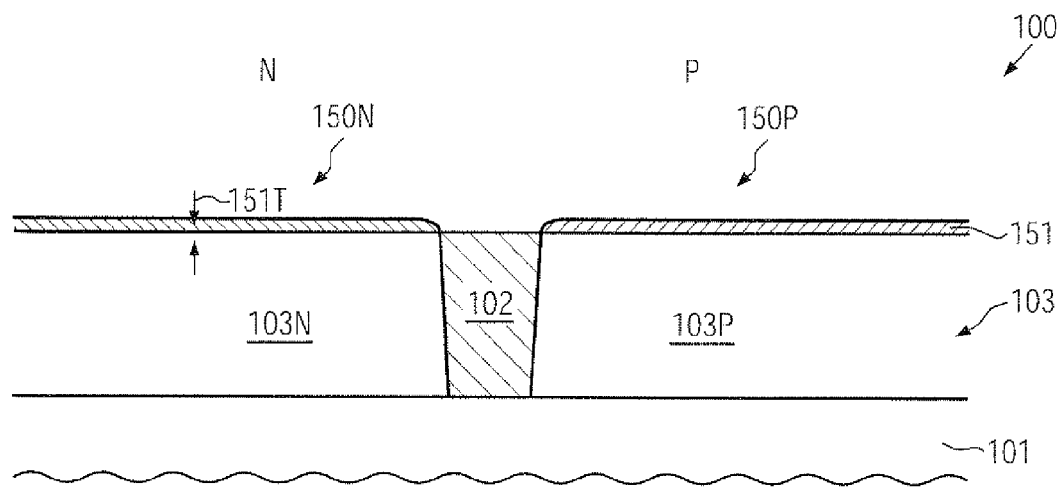
FIGS. 1a-1e schematically illustrate cross-sectional views of a semiconductor device during various manufacturing stages in forming a gate dielectric material of different thickness for a P-channel transistor and an N-channel transistor, respectively, on the basis of dedicated lithography processes, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides manufacturing techniques and semiconductor devices in which transistor degradation caused by NBTI and hot carrier injection may be reduced selectively for P-channel transistors, substantially without negatively affecting N-channel transistor performance. For this purpose, the characteristics of gate dielectric materials may be individually adapted for P-channel transistors and N-channel transistors, for instance with respect to thickness, material composition and the like, which may result in enhanced P-channel transistor reliability, while N-channel transistor performance may be maintained at a high level or may even receive enhanced performance characteristics due to the possibility of, for instance, providing an appropriately selected thickness, which may be less compared to advanced conventional semiconductor devices. To this end, an additional masking step may be introduced in order to provide a different gate dielectric thickness for P-channel transistors and N-channel transistors, at least in specific device regions, in which, in general, high performance transistor elements may be required due to the presence of critical signal paths and the like. Consequently, in this case, the P-channel transistor may receive an increased thickness of the gate dielectric material, thereby reducing threshold voltage variability during the operational lifetime of the semiconductor device, as previously explained, while, on the other hand, the N-channel transistors may receive a thickness of the gate dielectric material in accordance with the desired overall device performance. Since a single thickness of the gate dielectric material may no longer have to be selected in view of transistor performance and degradation mechanisms, generally, performance of the N-channel transistor may be maintained or even increased, while, on the other hand, a minor performance degradation of the P-channel transistor may be compensated for or even overcompensated for by achieving increased reliability and thus stability with respect to the above-identified degradation mechanisms, thereby allowing the application of a reduced guard band with respect to these degradation mechanisms. Thus, production yield for a specific product quality may be increased.

In other illustrative embodiments, an individual adaptation of characteristics of the gate dielectric materials for P-channel transistors and N-channel transistors may be accomplished without an additional lithography step by using the masking regime required for defining the basic well doping in the corresponding active regions. In this case, at least one of the masks for defining a well doping may also be used for adjusting, for instance, a thickness of a gate dielectric material, for instance by removing a portion of a previously formed base material or by otherwise preparing the active regions for receiving gate dielectric materials of different thickness.

In still other illustrative embodiments, the above-described concepts may be combined in any appropriate manner for forming gate dielectric materials of three or more different thickness values to provide an even further increased degree of flexibility in adjusting the characteristics of P-channel transistors and N-channel transistors with respect to performance and reliability. For example, high performance N-channel transistors may receive a very thin gate dielectric material, while less critical N-channel transistors may receive a somewhat thicker gate dielectric material, while P-channel transistors may have a gate dielectric of an even greater thickness to enhance the reliability thereof with respect to the above-identified degradation mechanisms. In other cases, a generally increased thickness of the gate dielectric material may be provided in specific device regions, such as memory areas and the like, while, in speed-critical device regions, such as logic functional blocks and the like, N-channel transistors may receive a thin gate dielectric material, while P-channel transistors may have a gate dielectric material of increased thickness, which may be greater or lesser than a thickness of gate material in the less critical device region, in which enhanced threshold stability may be desired. In other illustrative embodiments, in the regions of generally increased thickness of the gate dielectric materials, a difference may also be accomplished on the basis of the above-described process techniques.

It should be appreciated that the principles disclosed herein may be applied to highly scaled semiconductor devices, since here an undue increase in threshold voltage, in particular of P-channel transistors, may have a more pronounced effect on the overall performance characteristics compared to less critical semiconductor devices. It should be appreciated, however, that the techniques disclosed herein may be applied to any type of semiconductor device formed on the basis of well-established CMOS techniques, since the increased degree of flexibility in providing gate dielectric materials may also be advantageously exploited in view of overall gain in performance and reliability. Furthermore, it is to be noted that in the following description of further illustrative embodiments it is referred to as a planar transistor configuration since this type of transistor may currently represent the most dominant transistor architecture used in complex silicon-based integrated circuits. However, the concept of providing a gate dielectric material individually for P-channel transistors and N-channel transistors may be applied to other device architectures, such as FinFET architectures, in which the gate dielectric material may be formed on two or more surface layer portions of a semiconductor Fin. Thus, unless otherwise set forth in the description and/or the appended claims, the present disclosure should not be considered as being restricted to a specific planar transistor configuration.

FIG. 1a schematically illustrates a cross-sectional view of a semiconductor device 100 comprising a substrate 101 above which may be formed a semiconductor layer 103. The substrate 101 may represent any appropriate carrier material, such as a semiconductor material, a semiconductor material in combination with an insulating material and the like. In some illustrative embodiments, the substrate 101 may comprise substantially crystalline semiconductor surface portions in combination with surface portions formed by an insulating material. A corresponding configuration in which the semiconductor layer 103 is formed on an insulating surface portion of the substrate 101 may be referred to as a silicon-on-insulator (SOI) configuration, while a configuration in which the semiconductor layer 103 may be formed on a substantially crystalline semiconductor material of the substrate 101 may be referred to as a "bulk configuration." Thus, depending on the overall device requirements, the semiconductor device 100 may represent a bulk configuration, an SOI configuration or a mixed bulk and SOI configuration. The semiconductor layer 103 may represent a silicon-based layer, i.e., a silicon material which may also comprise other components, such as germanium, carbon, any appropriate dopant species and the like. In other cases, the semiconductor layer 103 may represent any other appropriate material or material composition in order to form therein and thereabove a P-channel transistor 150P and an N-channel transistor 150A.

In the manufacturing stage shown, the semiconductor layer 103 may comprise appropriate isolation structures 102, which may be provided in the form of a shallow trench isolation and the like. In the embodiment shown, the isolation structure 102 may separate an active region 103P of the P-channel transistor 150P from an active region 103N of the N-channel transistor 150N. It should be appreciated that an active region is to be understood as a region in the semiconductor layer 103 which may have a certain conductivity and which may receive one or more PN junctions of a transistor element. For this purpose, the active regions 103P, 103N may comprise a specific basic well doping which, in combination with a dopant species of opposite conductivity type, may provide respective PN junctions in a later manufacturing stage. Thus, the active region 103P may have a basic N-type well doping, while the active region 103N may have a basic P-type doping.

Moreover, in the manufacturing stage shown, a dielectric base material 151 may be formed on the active regions 103P, 103N with an appropriate material composition and thickness in accordance with the requirements of the P-channel transistor 150P and the N-channel transistor 150N. For example, the dielectric base material 151 may represent an oxide of the semiconductor material of the semiconductor layer 103, such as silicon dioxide and the like, while additional components, such as nitrogen and the like, may also be incorporated in the dielectric base material 151. It should be appreciated that the dielectric base material 151 may be substantially restricted to the surface of the active regions 103P, 103N, while, in other cases, the layer 151 may be provided as a substantially continuous layer, which may also extend across the isolation structure 102. In other illustrative embodiments, the dielectric base layer 151 may include materials of increased dielectric constant, which may also be referred to as high-k dielectric materials and which are understood as materials that may have a dielectric constant of approximately 10.0 and higher. For example, hafnium oxide, zirconium oxide and the like may represent appropriate candidates for high-k dielectric materials. A thickness 151T of the dielectric base layer 151 may be selected such that a combined thickness for the P-channel transistor 150P may be accomplished in a later manufacturing stage, when a gate dielectric material for the transistor 150N may be formed with a predefined thickness. For example, in sophisticated applications, the thickness 151T may range from approximately 0.8-2.0 nm, while it should be appreciated that other values may be selected if, in general, gate dielectric materials of a greater thickness may be used, for instance when providing a high-k dielectric material.

The semiconductor device 100 as shown in FIG. 1a may be formed on the basis of the following processes. Prior to or after forming the isolation structure 102, the basic well doping in the active regions 103P, 103N may be formed by using well-established masking regimes. That is, the active region 103P may be covered by a resist mask, while implanting the desired dopant species into the active region 103N. On the other hand, the active region 103N may be masked and an N-type dopant species may be introduced into the active region 103P. The isolation structure 102 may be formed by using well-established process regimes, including lithography techniques, etch techniques, deposition and planarization processes. For example, the isolation structure 102 may be comprised of silicon dioxide, silicon nitride and the like. Thereafter, the surface of the semiconductor layer 103 may be prepared for forming the dielectric base material 151, which may involve appropriate cleaning processes using wet chemical etch chemistries, such as ammonia peroxide mixture (APM) and the like. Next, the dielectric base material 151 may be formed in accordance with any appropriate manufacturing technique. For instance, at least a portion of the layer 151 may be formed by an oxidation process, which may be performed in a furnace with a well-controlled oxygen-containing ambient, thereby providing a slow and controllable oxidation growth on exposed surface portions of the active regions 103P, 103N. The corresponding oxidation process may be controlled so as to obtain the desired thickness 151T. Moreover, additional process steps may be performed, for instance other species may be incorporated into the layer 151, such as nitrogen and the like, if required by the overall process strategy. In other cases, any other appropriate atom species may be added to the oxidation ambient in order to obtain the desired overall material composition. In still other illustrative embodiments, the layer 151 may be formed by deposition, or at least a portion of the layer 151 may be formed by deposition, such as depositing a high-k dielectric material by chemical vapor deposition (CVD) techniques. For example, a thin oxide layer (not shown) in combination with a high-k dielectric material (not shown) may be provided by an oxidation process and a subsequent deposition step.

Figure 1B:
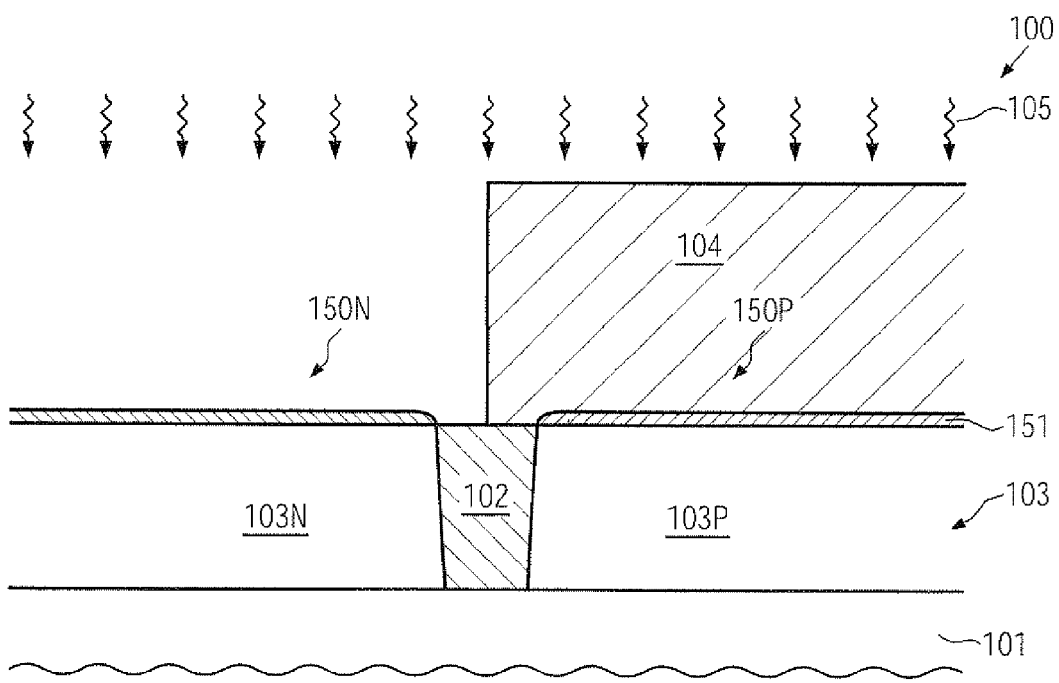

FIG. 1b schematically illustrates the semiconductor device 100 in a further advanced manufacturing stage. As illustrated, a mask 104, such as a resist mask and the like, may be provided so as to expose the active region 103N, i.e., the portion of the layer 151 formed thereon, and to cover the active region 103P. Furthermore, the semiconductor device 100 is exposed to an etch ambient 105, which may be established in the form of a wet chemical etch process or a plasma-based etch process, depending on the material composition of the layer 151. For example, silicon nitride material and a plurality of other dielectric materials which may frequently be used as a gate dielectric material may be efficiently removed by well-established etch techniques.

Figure 1C:
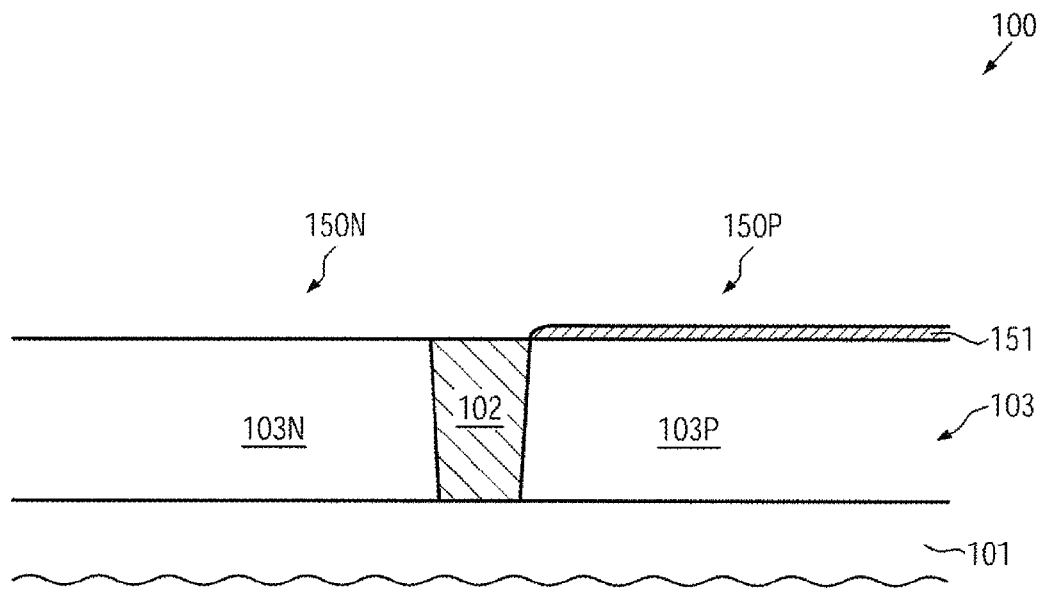

FIG. 1c schematically illustrates the semiconductor device 100 after the etch process 105 and the removal of the mask 104 (FIG. 1b). Hence, the active region 103N may be exposed so as to receive a gate dielectric material having a thickness as is appropriate for the transistor 150N. On the other hand, the remaining portion of the layer 151 may act as a first part of a gate dielectric material for the transistor 150P so that a final thickness may be increased without affecting a thickness of a gate dielectric material in the transistor 150N. Moreover, in the manufacturing stage shown, an appropriate cleaning process may be performed, for instance on the basis of well-established wet chemical recipes, for instance using APM and the like. In this manner, residues of the previous manufacturing steps and other particles and contaminations may be reduced.

Figure 1D:
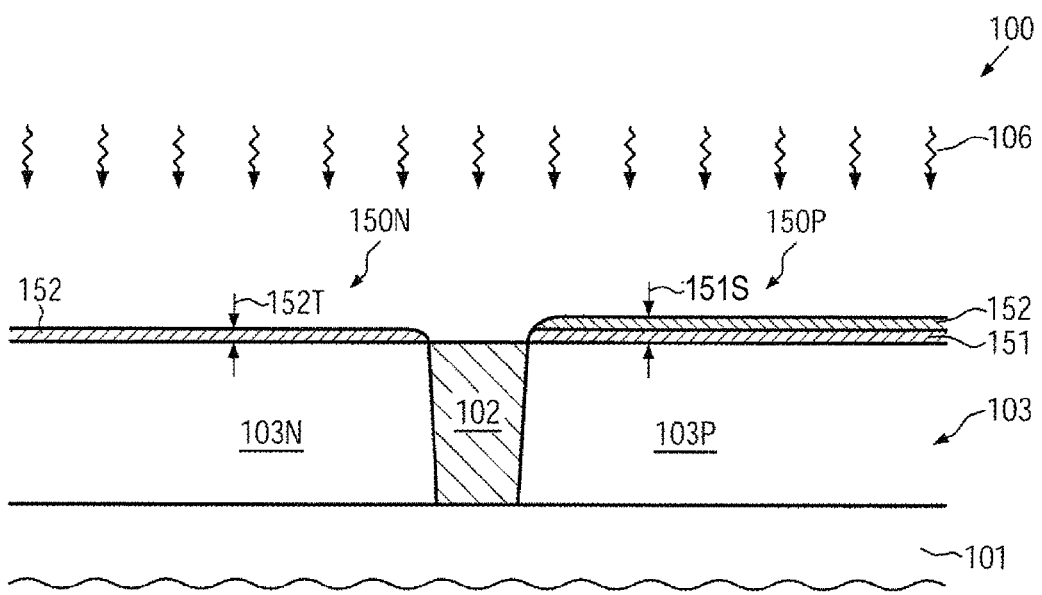

FIG. 1d schematically illustrates the semiconductor device 100 during a process 106 for forming a dielectric material 152 on the active region 103N and on the material 151 located on the active region 103P. In some illustrative embodiments, the process 106 may represent an oxidation process, wherein an appropriate oxidizing ambient may be established at elevated temperatures in order to grow an oxide material on the active region 103N and further increasing a thickness of the material 151 above the active region 103P. In this case, the growth rate for the layer 152 above the active region 103N and the active region 103P may be different due to the different starting conditions of the growth process, which may thus result in a different thickness of the respective oxidized portions in the active regions 103N, 103P, respectively. A corresponding difference in the growth rate may be determined in advance so that a combined thickness 151S above the active region 103P may be selected on the basis of a thickness of the layer 151 (FIG. 1a) in combination with a desired thickness 152T of the layer 152 above the active region 103N. Hence, the N-channel transistor 150N may receive the gate dielectric material with the thickness 152T, which may be selected with respect to performance and reliability aspects of this transistor, while the combined thickness 151S may be selected in view of enhanced reliability for the P-channel transistor 150P, as previously explained. In other illustrative embodiments, the process 106 may represent a deposition process in order to provide the layer 152 with a desired composition and thickness.

For example, advanced CVD process techniques, atomic layer deposition (ALD) and the like may be used in order to deposit a desired material, wherein high-k dielectric materials may also be provided, as previously explained. Furthermore, in still other illustrative embodiments, the process 106 may represent any appropriate surface treatment, such as oxidation on the basis of wet chemical agents, nitridation and the like as deemed appropriate for providing the layer 152 in the form of a dielectric material for the transistor 150N, while enhancing a thickness of the base material 151 above the active region 103P.

Figure 1E:
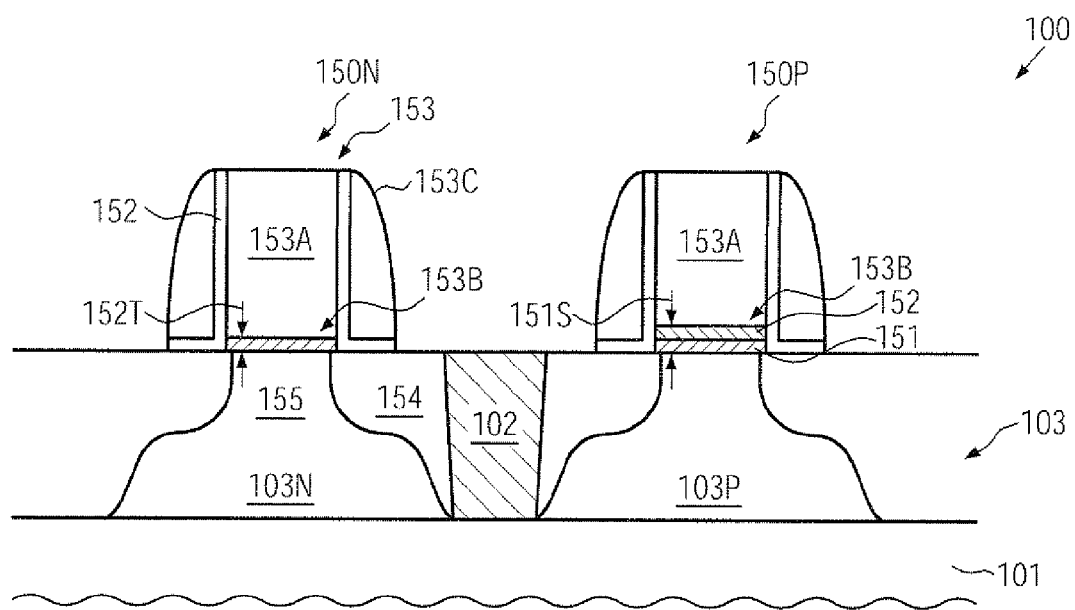

FIG. 1e schematically illustrates the semiconductor device 100 in a further advanced manufacturing stage. As illustrated, the transistors 150P, 150N may comprise a gate electrode structure 153, which may include a gate electrode material 153A, which may represent any appropriate material, such as polysilicon, polysilicon in combination with a metal-containing material and the like, depending on device requirements. Furthermore, the gate electrode structure 153 may comprise a gate insulation layer 153B separating the gate electrode material 153A from a channel region 155, which in turn is laterally enclosed by drain and source regions 154. Furthermore, the gate electrode structures 153 may comprise a spacer structure 153C in accordance with the overall device requirements and the process strategy used for forming the transistors 150P, 150N. It should be appreciated that one or both of the transistors 150P, 150N may comprise additional components, such as strain-inducing sources, in order to adjust the overall electrical performance of one or both of the transistors 150P, 150N. For example, the transistor 150P may comprise an embedded semiconductor material within the active region 103P, such as silicon/germanium and the like, in order to provide a desired strain component in the channel region 155. Similarly, the transistor 150N may comprise a strained and thus strain-inducing semiconductor material within the drain and source regions 154, thereby obtaining a desired strain component, such as a tensile strain component, in the adjacent channel region 155. For convenience, any such additional mechanisms and/or materials for enhancing overall device performance are not shown in FIG. 1e. Furthermore, as illustrated, the gate insulation layer 153B of the transistor 150N may be comprised of the layer 152 having the thickness 152T, which may be selected so as to obtain the desired electrical performance of the transistor 150N, wherein the dopant profiles and concentrations in the active region 103N may be adapted to the thickness 152T. This is different, compared to conventional strategies in which the gate insulation layers 153B are provided in a common manufacturing process, so that the material composition and the thickness thereof may have to be adapted to the performance criteria as well as to the reliability criteria, in particular of the P-channel transistors. On the other hand, the gate insulation layer 153B of the transistor 150P may be comprised of the materials 151 and 152 having the thickness 151S, which may provide enhanced reliability with respect to the above-identified degradation mechanisms so that the overall behavior in view of threshold variability over product lifetime may be enhanced. Consequently, a reduced device performance caused by the increased thickness 151S compared to conventional strategies may be compensated for or even overcompensated for by a performance gain of the N-channel transistor 150N and the possibility of defining narrower guard bands with respect to NBTI and hot carrier injection behavior of the P-channel transistors so that, in total, an increased number of products including the transistors 150P, 150N may fulfill a specific high quality criterion. Thus, production yield with respect to a specified high product quality may be increased, possibly in combination with an overall enhancement of product performance.

The semiconductor device 100 as shown in FIG. 1e may be formed on the basis of the following processes. Starting from the device configuration as shown in FIG. 1d, an appropriate gate electrode material or placeholder material may be deposited, for instance by well-established low pressure CVD techniques, if a polysilicon material is to be provided. The gate electrode material, possibly in combination with other materials, such as cap materials, anti-reflective coating (ARC) materials, may be patterned by using sophisticated lithography and etch techniques, for instance based on well-known process strategies. Thereafter, appropriate dopant species may be introduced and the spacer structures 153C or individual spacer elements thereof may be formed in combination with the performing of implantation processes so as to obtain the desired lateral and vertical dopant profiles for the drain and source regions 154. Upon a corresponding anneal process, the final dopant profile may be adjusted in order to provide the device configuration as shown in FIG. 1e. Thereafter, the further processing may be continued, for instance by forming a metal silicide in the drain and source regions 154 and the gate electrode structures 153, followed by the deposition of an interlayer dielectric material in order to passivate the transistors 150P, 150N. The corresponding process sequence for providing the interlayer dielectric material may include the provision of highly stressed dielectric materials in order to provide a desired strain component in the channel regions 155 for further enhancing overall device performance, depending on the overall process and device requirements. Thereafter, a contact structure may be formed and additional wiring layers, i.e., metallization layers, may be provided to establish the electrical connections between the individual circuit elements of the device 100, such as the transistors 150P, 150N.

With reference to FIGS. 2a-2e, further illustrative embodiments will now be described in which the characteristics of a gate dielectric material, for instance the thickness thereof, may be individually adapted for P-channel transistors and N-channel transistors without additional lithography steps.

Figure 2A:
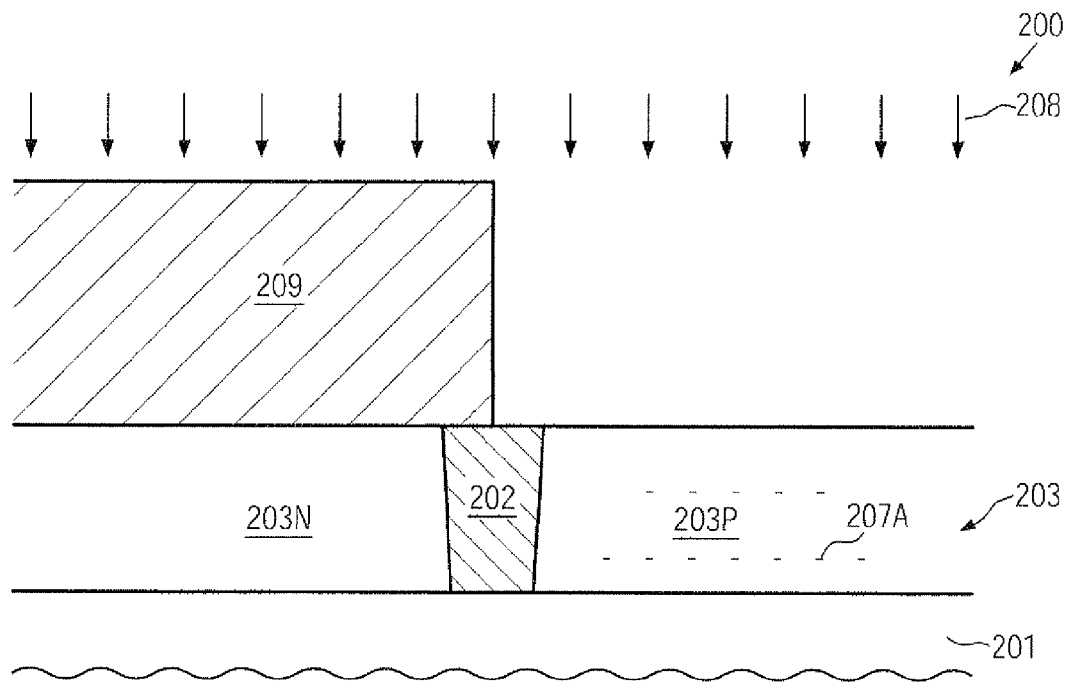
FIGS. 2a-2e schematically illustrate cross-sectional views of a semiconductor device during various manufacturing stages in which a gate dielectric material may be individually adjusted, for instance with respect to thickness, material composition and the like, during a sequence of defining respective well dopings, according to further illustrative embodiments.

FIG. 2a schematically illustrates a semiconductor device 200 comprising a substrate 201, above which may be formed a semiconductor layer 203. Moreover, in the embodiment shown, an isolation structure 202 may be provided to define an active region 203P for a P-channel transistor and an active region 203N for an N-channel transistor. It should be appreciated that, in other cases, the isolation structure 202 may not yet be provided in this manufacturing stage. With respect to the components described so far, the same criteria may apply as previously explained with reference to the semiconductor device 100. It should be appreciated, however, that, in the manufacturing stage shown, a dopant species 207A may be provided in the active region 203P, thereby defining an appropriate well doping, which may adjust the basic conductivity type of the transistor under consideration. In the embodiment shown, the dopant species 207A may represent an N-type dopant species so that the active region 203P may represent the active region of a P-channel transistor.

The dopant species 207A may be introduced on the basis of an implantation process 208, which may be performed on the basis of an implantation mask 209, which covers the active region 203N in order to avoid penetration of the dopant species 207A in the active region 203N. The implantation mask 209 may be formed on the basis of well-established masking techniques. Also, the implantation process 208 may be performed on the basis of well-established process techniques.

Figure 2B:
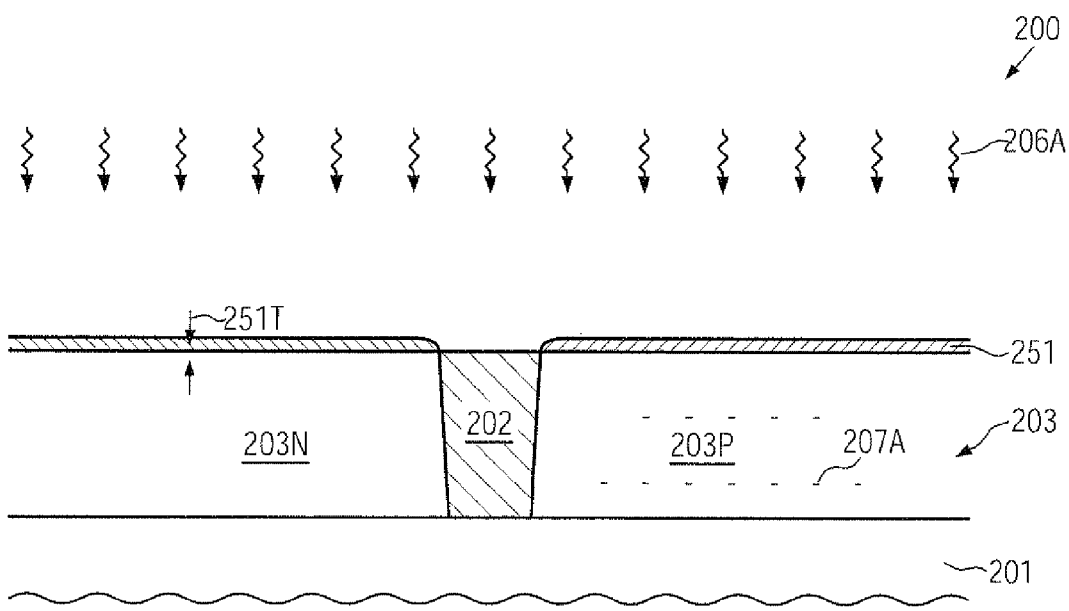

FIG. 2b schematically illustrates the semiconductor device 200 in a further advanced manufacturing stage, i.e., after removal of the mask 209 and after a corresponding cleaning process for preparing the active regions 203P, 203N for a process 206A for forming a dielectric base material 251. For example, the process 206A may represent an oxidation process, for instance, by using elevated temperatures in combination with an oxidizing ambient, a wet chemical oxidation ambient and the like. In other cases, in addition to or alternatively to an oxidation process, any other surface treatment may be used to obtain the desired material composition of the layer 251. In other cases, additionally or alternatively to an oxidation process or any other surface treatment, a deposition process may be performed to provide the layer 251 with the material composition and a thickness as required for the further processing of the device 200. In this case, the material layer 251, or at least a portion thereof, may also be formed above the isolation structure 202. In some illustrative embodiments, a thickness 251T of the layer 251 may be selected according to similar criteria as previously explained with reference to the layer 151 and the thickness 151T. That is, the thickness 251T may represent a base thickness, which may be increased in a later manufacturing stage selected above the active region 203P so as to obtain the finally desired thickness, while at the same time a reduced thickness may be accomplished above the region 203N.

Figure 2C:
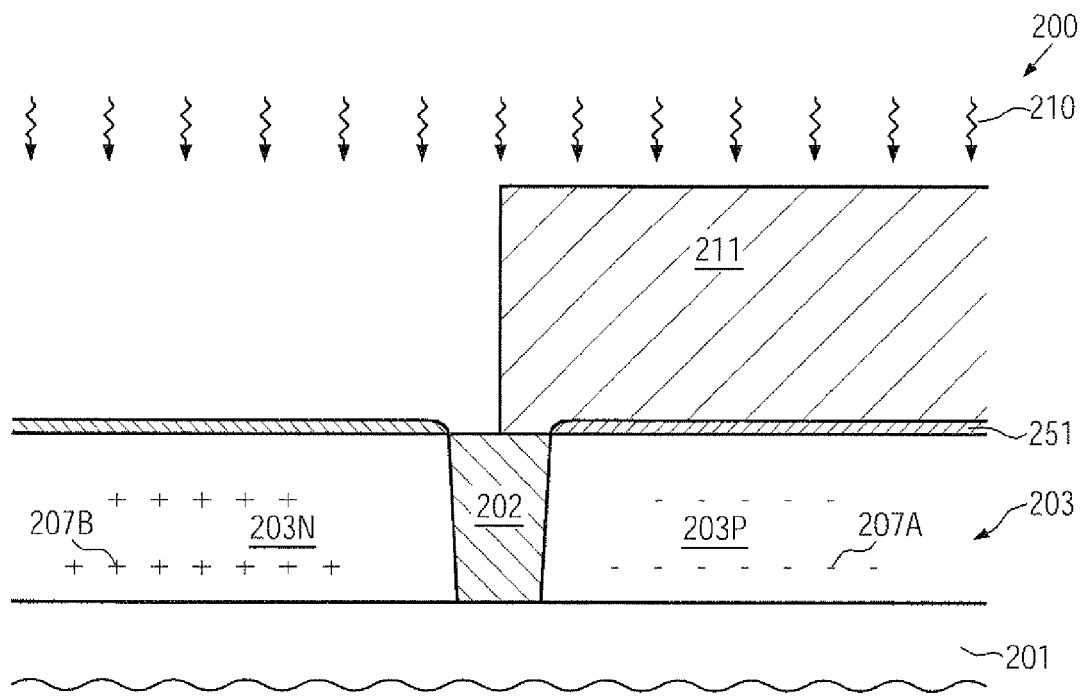

FIG. 2c schematically illustrates the semiconductor device 200 during a further implantation process 210 performed on the basis of a mask 211, which may cover the active region 203P while exposing the active region 203N. During the implantation process 210, an appropriate dopant species 207B may be introduced in order to define a desired basic well doping for the active region 203N, whereas, in this case, a P-type dopant species may be incorporated in order to form an N-channel transistor in and above the active region 203N.

Figure 2D:
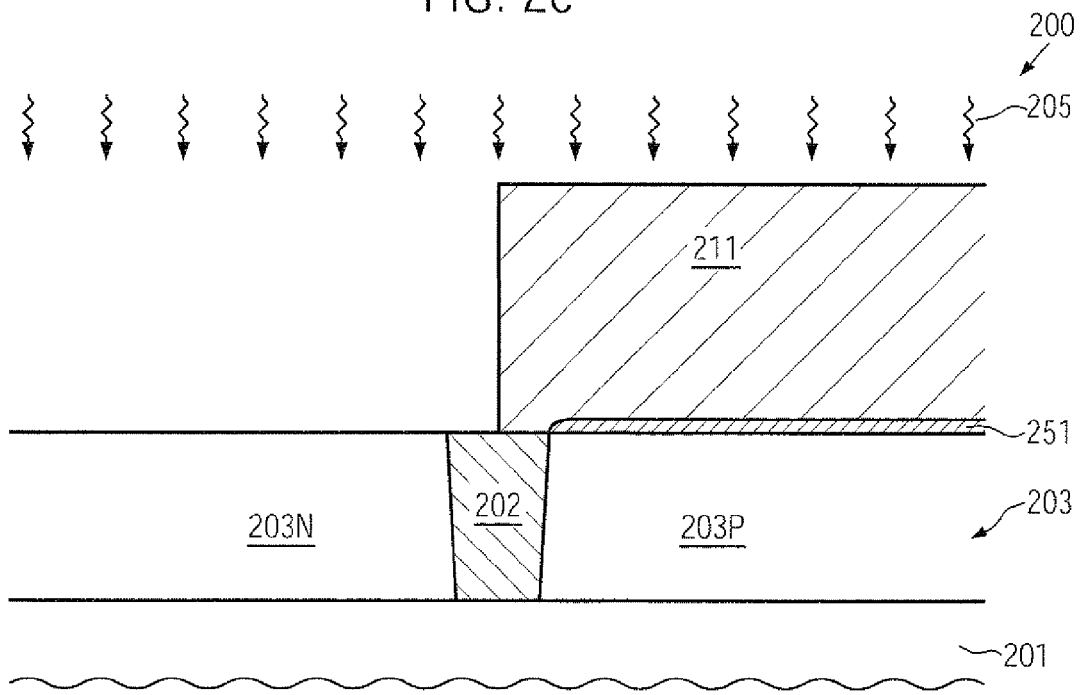

FIG. 2d schematically illustrates the semiconductor device 200 during an etch process 205 which may be established on the basis of an etch ambient designed to selectively remove the material of the layer 251. The etch process 205 may be performed on the basis of the mask 211, thereby avoiding any additional lithography process in order to provide different gate dielectrics above the active regions 203P, 203N. After the etch process 205, which may be performed by using well-established etch techniques, as previously described, the mask 211 may be removed and an appropriate cleaning process may be performed to prepare the device 200 for a further process for forming a gate dielectric material.

Figure 2E:
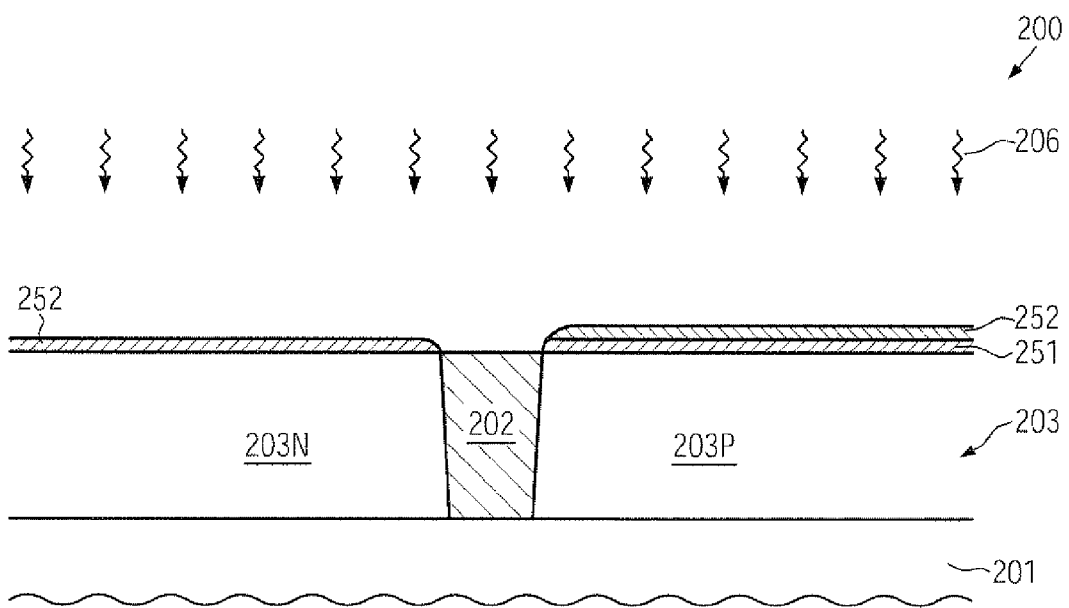

FIG. 2e schematically illustrates the device 200 during a process 206 designed to provide a gate dielectric material 252. As previously explained, the process 206 may represent nitridation and the like, possibly in combination with a deposition process. In other cases, the process 206 may include one or more deposition steps, without any additional surface treatment processes. Hence, the gate dielectric material 252 may be provided with any desired thickness and material composition in accordance with the overall device requirements for transistors to be formed in and above the active regions 203P, 203N. Based on the device configuration as shown in FIG. 2e, further processing may be continued, as is for instance described with reference to the semiconductor device 100. Consequently, a different thickness and/or material composition of a gate dielectric material may be provided for N-channel transistors and P-channel transistors without requiring additional lithography steps by appropriately combining the process of defining the basic doping with the process of forming gate dielectric materials of different thickness or other characteristics.

With reference to FIGS. 3a-3d, further illustrative embodiments will now be described in which gate dielectric materials of more than two different thickness values may be provided.

Figure 3A:
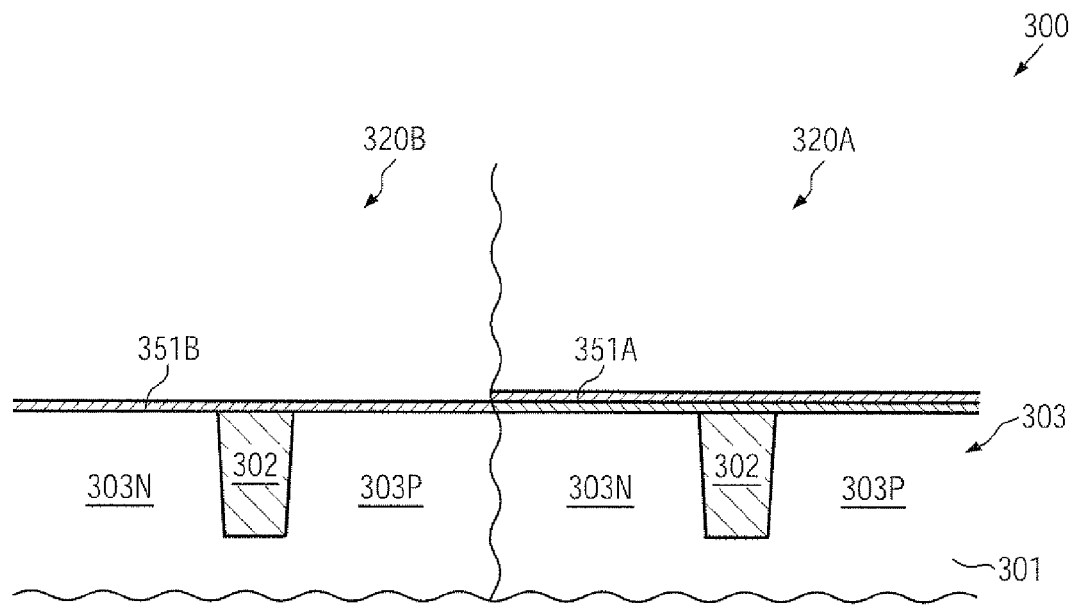
FIGS. 3a-3d schematically illustrate cross-sectional views of a semiconductor device during various manufacturing stages in forming gate dielectric materials of different thickness for a plurality of transistor elements, according to still further illustrative embodiments.

FIG. 3a schematically illustrates a semiconductor device 300 comprising a substrate 301, above which may be formed a semiconductor layer 303, which may comprise a plurality of isolation structures 302. With respect to these components, the same criteria apply as previously explained with reference to the devices 100 and 200. Furthermore, the semiconductor device 300 may comprise a first device region 320A, which may, in general, require a gate dielectric material of increased thickness. Furthermore, a second device region 320B may be provided, in which high performance transistor elements are to be formed, such as transistors required in speed-critical signal paths and the like. It should be appreciated that, in sophisticated semiconductor devices, frequently, different device areas may require a different configuration of the transistors and, in particular, of the gate dielectric material thereof. For instance, the device regions 320A, 320B may be operated with a different operating voltage, which may require a general increased stability and dielectric strength of corresponding gate dielectric materials. In other cases, transistor performance may be less critical in the region 320A while enhanced threshold stability may be required, for instance, when the region 320A may comprise static RAM (random access memory) areas, as may be the case in advanced microprocessors. Furthermore, in the manufacturing stage shown, a first base material 351A may be formed on active regions 303P, 303N of the device region 320A. For instance, the first base material 351A may be comprised of two different material layers or may represent a continuous material having an increased thickness compared to a second base material 351B formed on active regions 303P, 303N of the second device region 320B. For instance, the base materials 351A, 351B may represent oxide-based materials and the like, as is also previously discussed for the base materials 151 and 251.

The semiconductor device 300 as shown in FIG. 3a may be formed on the basis of the following processes. After defining the active regions 303P, 303N in the first and second device regions 320A, 320B and after forming the isolation structures 302, a dielectric material may be formed, for instance by oxidation, and may be selectively removed from above the second device region 320B using appropriately designed photomasks. Next, a further dielectric material may be formed, for instance by oxidation and the like, thereby providing the layer 351B having a reduced thickness in the device region 320B, while increasing a thickness of the remaining portion of the previously formed dielectric material, thereby providing the first base material 351A having the desired increased thickness.

Figure 3B:
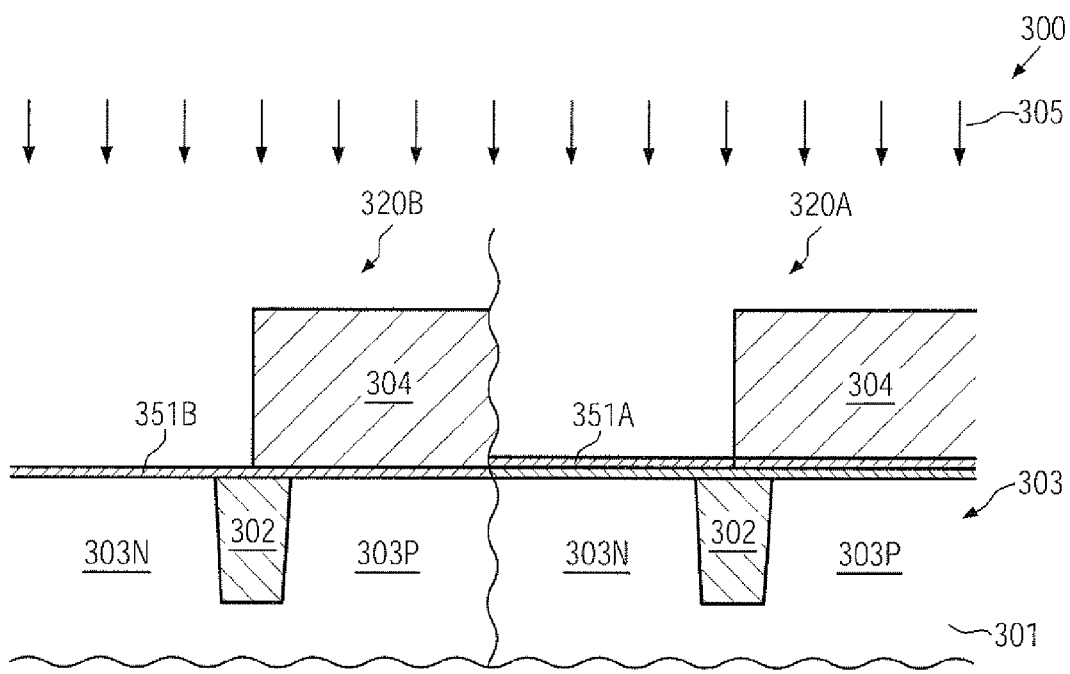

FIG. 3b schematically illustrates the semiconductor device 300 in an advanced manufacturing stage. In the embodiment shown, a mask 304, such as a resist mask, is provided so as to expose a portion of the first device region 320A and of the second device region 320B, while covering respective portions of the first and second device regions 320A, 320B during an etch process 305. In the embodiment shown, different thickness values for the dielectric materials of P-channel transistors and N-channel transistors may be required in the first and second device regions 320A, 320B. In this case, the mask may expose the active regions 303N of the first and second device regions 320A, 320B, which may represent corresponding N-channel transistors. In other illustrative embodiments (not shown), the mask 304 may cover the entire region 320A, if a corresponding difference in thickness may not be desired in the first region 320A. The etch process 305 may be performed on the basis of any appropriate etch recipe, as previously explained.

Figure 3C:
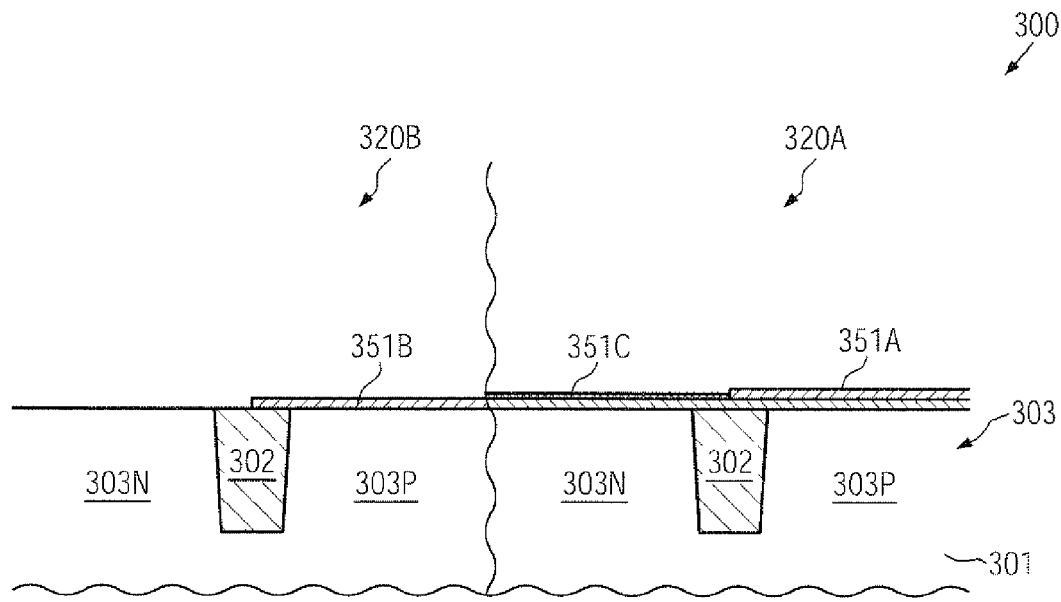

FIG. 3c schematically illustrates the semiconductor device 300 after the etch process 305 and after removal of the etch mask 304. Hence, in the second device region 320B, the active region 303N may be exposed while the layer 351B may be maintained above the active region 303P. In the first device region 320A, the previously formed first dielectric base material 351A may be maintained above the active region 303P, while a material 351C may be formed above the active region 303N due to the etch process 305. That is, due to the initially greater thickness of the material 351A, a reduction in thickness may occur, substantially without exposing the active region 303N in the first device region 320A. Depending on the overall device requirements, a thickness of the layer 351C may be greater or may be less than a thickness of the layer 351B. That is, if desired, a final thickness of the gate dielectric material above the active region 303N in the first device region 320A may be less than a final thickness of a P-channel transistor of the second device region 320B, while, in other cases, the finally obtained thickness of the gate dielectric material of the N-channel transistor in the first device region 320A may be greater than a final thickness of the gate dielectric material of the P-channel transistor in the second device region 320B.

Figure 3D:
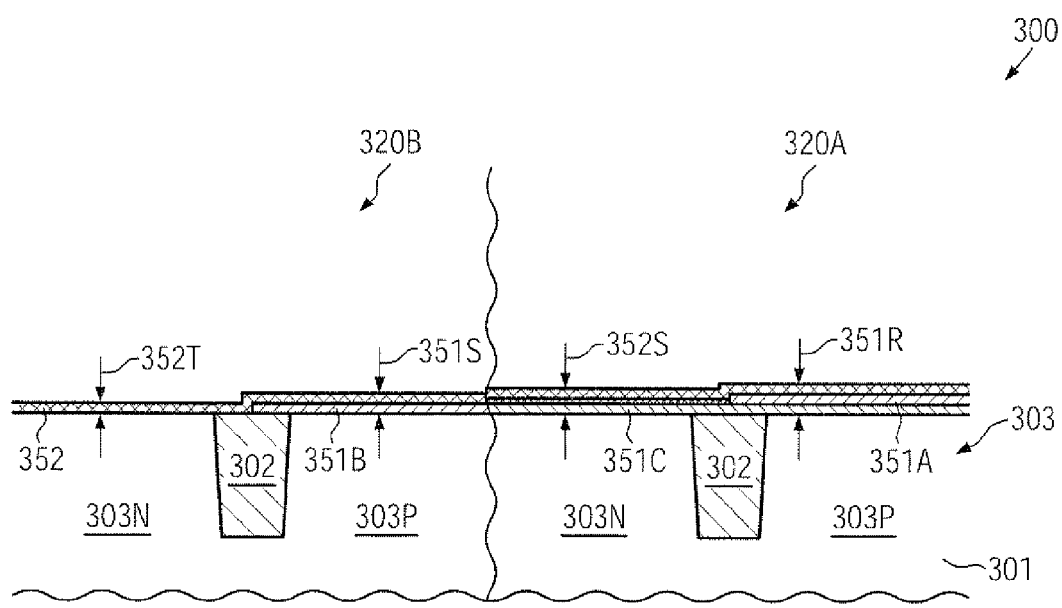

FIG. 3d schematically illustrates the semiconductor device 300 in a further advanced manufacturing stage. That is, a further dielectric material 352 may be formed in the first and second device regions 320A, 320B, thereby obtaining a difference in the active regions 303P, 303N in the device regions 320A, 320B. That is, the gate dielectric material 352 may define a third thickness 352T above the active regions 303N of the second device region 320B, thereby allowing enhanced transistor performance of an N-channel transistor, as previously explained. Similarly, above the active region 303P of the second device region 320B, the material 352, in combination with the material 351B, define a thickness 351S so as to provide enhanced reliability of a P-channel transistor. In the active region 303N of the first device region 320A, the material 352, in combination with the material 351C, may define a third thickness 352S, which may be less or greater than the thickness 351S, as previously explained. Thus, a moderate performance may be obtained for an N-channel transistor in the first device region 320A. Moreover, the material 352, in combination with the material 351A, may define a fourth thickness 351R, which may be appropriate for P-channel transistors in the device region 320A. Based on the different thickness values in the first and second device regions 320A, 320B, the further processing may be continued on the basis of well-established process techniques to form respective transistor elements in and above the active regions 303P, 303N. Hence, an individual adaptation of a gate dielectric material for P-channel transistors and N-channel transistors may be accomplished on the basis of a device configuration, which may per se require a different type and/or thickness of gate dielectric material in different device regions.

As a result, the present disclosure provides techniques and semiconductor devices in which P-channel transistors and N-channel transistors may receive a gate dielectric material of different thickness so as to individually adapt overall device performance and reliability. In some illustrative embodiments, P-channel transistors may receive a dielectric material of increased thickness compared to N-channel transistors so as to reduce the effect of degradation mechanisms, such as negative bias, threshold instability and hot carrier injection, while substantially not negatively influencing performance of N-channel transistors or even further enhanced performance thereof, since a reduced thickness may be used compared to conventional strategies. This may be accomplished by performing an additional lithography step for selectively providing the conditions for gate dielectric materials of different thickness, for instance by removing a portion of a previously formed base material and subsequently providing an additional gate dielectric material. In other cases (not shown), the growth rate during an oxidation process may be selectively adjusted for P-channel transistors and N-channel transistors, for instance by performing an implantation process, or any other surface treatment which may result in a different diffusion rate and thus oxidation rate. The principle of providing an additional lithography mask for individually adapting the thickness of the gate dielectric material for P-channel transistors and N-channel transistors may be applied more than once to further "refine" the thickness distribution for P-channel transistors and N-channel transistors across a specified device region. That is, particularly, performance driven N-channel transistors may receive a very thin gate dielectric material, while other speed-critical N-channel transistors may receive a moderately thin gate dielectric material, however, with a slightly increased thickness compared to the most critical transistors. On the other hand, P-channel transistors may receive an increased thickness and may therefore exhibit enhanced reliability, as previously discussed. If a further refinement may be required, additional lithography processes may be performed. In other illustrative embodiments, an individual adjustment of the thickness of gate dielectric materials for P-channel transistors and N-channel transistors may be accomplished on the basis of a masking regime as may be used for defining the basic well doping in the corresponding active regions. Hence, a highly efficient overall manufacturing flow may be obtained while nevertheless providing enhanced reliability of P-channel transistors, while substantially not negatively affecting performance of N-channel transistors or even enhanced performance thereof.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a gate dielectric material, the method comprising:
   forming a first dielectric base material on a first active region, said first active region comprising a first portion having a first well doping of a first conductivity type and a second portion having a second well doping of a second conductivity type;
   forming a second dielectric base material on a second active region, said second active region comprising a first portion having said first well doping and a second portion having said second well doping;
   forming a mask that exposes said second portions of said first and second active regions and covers said first portions of said first and second active regions;
   selectively removing only an upper portion of said exposed portion of said first dielectric base material and completely removing said exposed portion of said second dielectric base material using said mask, wherein a portion of said first dielectric material remains above said second portion of said first active region;
   removing said mask; and
   forming a further dielectric material above said first and second active regions so as to obtain a first gate dielectric material comprised of said first dielectric base material and said further dielectric material on said first portion of said first active region, a second gate dielectric material comprised of said remaining portion of said first dielectric base material and said further dielectric material on said second portion of said first active region, a third gate dielectric material comprised of said second dielectric base material and said further dielectric material on said first portion of said second active region, and a fourth gate dielectric material comprised of said further dielectric material on said second portion of said second active region, wherein a thickness of each of said second and third gate dielectric materials are less than a thickness of said first gate dielectric material and a thickness of said fourth gate dielectric material is less than said thicknesses of each of said first, second and third gate dielectric materials.

2. The method of claim 1, wherein said second well doping in said second portion of said second active region is formed prior to completely removing said exposed portions of said second dielectric base material from said second active region.

3. The method of claim 1, wherein at least one of forming said first and second dielectric base materials and said further dielectric material comprises performing an oxidation process.

4. The method of claim 1, wherein at least one of forming said first and second dielectric base materials and said further dielectric material comprises performing a deposition process.

5. The method of claim 1, wherein said second well doping is a P-type doping.

6. The method of claim 5, wherein said first well doping is an N-type doping.

7. The method of claim 1, wherein said thickness of said second gate dielectric material is less than said thickness of said third gate dielectric material.

8. The method of claim 1, wherein said thickness of said third gate dielectric material is less than said thickness of said second gate dielectric material.

9. A method, comprising:
   forming a first dielectric base material on a first active region of a semiconductor device, wherein said first dielectric base material has a first thickness, and said first active region comprises first and second portions;
   forming a second dielectric base material on a second active region of said semiconductor device, wherein said second dielectric base material has a second thickness that is less than said first thickness, and said second active region comprises first and second portions;
   patterning said first dielectric base material by selectively removing an upper portion only of said first dielectric base material from above said second portion of said first active region to thereby define a remaining portion of said first dielectric base material having a third thickness that is different than said first and second thicknesses;
   patterning said second dielectric base material by completely removing said second dielectric base material from above said second portion of said second active region;

after patterning said first and second dielectric base materials, forming a third dielectric material having a fourth thickness above said first and second active regions to form a first gate dielectric material comprised of said first dielectric base material and said third dielectric material above said first portion of said first active region, a second gate dielectric material comprised of said remaining portion of said first dielectric base material and said third dielectric material above said second portion of said first active region, a third gate dielectric material comprised of said second dielectric base material and said third dielectric material above said first portion of said second active region, and a fourth gate dielectric material comprised of said third dielectric material above said second portion of said second active region, wherein said second gate dielectric material has a thickness that is less than a thickness of said first gate dielectric material and said fourth gate dielectric material has a thickness that is less than a thickness of said third gate dielectric material and said thicknesses of each of said first and second gate dielectric materials;

forming a first P-channel transistor comprised of said first gate dielectric material in and above said first portion of said first active area;

forming a first N-channel transistor comprised of said second gate dielectric material in and above said second portion of said first active area;

forming a second P-channel transistor comprised of said third gate dielectric material in and above said first portion of said second active area; and forming a second N-channel transistor comprised of said fourth gate dielectric material in and above said second portion of said second active area.

10. The method of claim 9, wherein forming said second N-channel transistor comprises forming a mask to cover said first portion of said second active region and to expose said second portion of said second active region, and incorporating a P-type dopant species into said second portion of said second active region using said mask.

11. The method of claim 9, wherein patterning said first and second dielectric base materials comprises:

forming a mask above said semiconductor device to cover said first portions of said first and second active regions and to expose said second portions of said first and second active regions; and performing an etch process.

12. The method of claim 9, wherein said third thickness is less than said second thickness and said thickness of said second gate dielectric material is less than said thickness of said third gate dielectric material.

13. The method of claim 9, wherein said second thickness is less than said third thickness and said thickness of said third gate dielectric material is less than said thickness of said second gate dielectric material.

14. The method of claim 9, wherein said first dielectric base material comprises one material layer.

15. The method of claim 9, wherein said first dielectric base material comprises two different material layers.

16. The method of claim 9, wherein forming at least one of said first and second dielectric base materials and said third dielectric material comprises performing an oxidation process.

17. The method of claim 9, wherein forming at least one of said first and second dielectric base materials and said third dielectric material comprises performing a deposition process.

18. The method of claim 10, wherein said P-type dopant species is introduced prior to completely removing said second base dielectric material from above said second portion of said second active region.

19. The method of claim 9, wherein said thickness of at least one of said second and fourth gate dielectric materials is approximately 1.5 nm or less.

20. The method of claim 9, wherein at least one of said first, second, third and fourth gate dielectric materials comprises a dielectric material having a dielectric constant of approximately 10 or greater.

* * * * *